US012716922B2

(12) United States Patent
Tsubomatsu

(10) Patent No.: US 12,716,922 B2
(45) Date of Patent: Aug. 25, 2026

(54) ACCELERATOR SYSTEM AND DISCHARGE DETECTOR

(71) Applicant: SUMITOMO HEAVY INDUSTRIES, LTD., Tokyo (JP)

(72) Inventor: Satoshi Tsubomatsu, Niihama (JP)

(73) Assignee: SUMITOMO HEAVY INDUSTRIES, LTD., Tokyo (JP)

( * ) Notice: Subject to any disclaimer, the term of this patent is extended or adjusted under 35 U.S.C. 154(b) by 48 days.

(21) Appl. No.: 18/991,301

(22) Filed: Dec. 20, 2024

(65) Prior Publication Data

US 2025/0208177 A1 Jun. 26, 2025

(30) Foreign Application Priority Data

Dec. 25, 2023 (JP) ................................ 2023-218202

(51) Int. Cl.
*G01R 19/165* (2006.01)
*H05H 13/00* (2006.01)

(52) U.S. Cl.
CPC ..... *G01R 19/16576* (2013.01); *H05H 13/005* (2013.01)

(58) Field of Classification Search
CPC .............. G01R 19/16576; G01R 31/12; H05H 13/005; H05H 7/22; H05H 7/00; H05H 7/18
See application file for complete search history.

(56) References Cited

U.S. PATENT DOCUMENTS

2020/0091757 A1* 3/2020 Suzuki ...................... H02J 7/64
2020/0211886 A1* 7/2020 Kashimura ........... H10P 72/722

FOREIGN PATENT DOCUMENTS

JP 2004119995 A * 4/2004
JP 2019110040 A * 7/2019
KR 20130131248 A * 12/2013 ............... H05H 7/00
KR 20210084256 A * 7/2021 ............ H10P 50/642

* cited by examiner

*Primary Examiner* — Seokjin Kim
(74) *Attorney, Agent, or Firm* — WTA IP Law P.C.

(57) ABSTRACT

An accelerator system includes an accelerator that accelerates particles, and a discharge detector that detects discharge inside the accelerator, in which the discharge detector blocks the discharge at a preliminary stage in which an influence of the discharge occurs inside the accelerator, based on detecting continuous discharge.

11 Claims, 8 Drawing Sheets

100
101
50
HOST SYSTEM
1
ACCELERATOR
51
CONTROL UNIT
52
AMPLIFIER
CAVITY
6
DISCHARGE DETECTOR
60

100
1
3
4
5
6
7
8
9
10
11

60
DISCHARGE THRESHOLD
CAVITY VOLTAGE
61
DISCHARGE DETECTION CIRCUIT
PARAMETER 1: DURATION
62
DISCHARGE CONTINUATION DETECTION CIRCUIT
63
SECTION DISCHARGE FREQUENCY CONFIRMATION CIRCUIT
PARAMETER 1: NUMBER OF COUNTS 2: COUNT TIME
64A
LATCH
64B
LATCH
65

200
101
1
ACCELERATOR
6
CAVITY
52
AMPLIFIER
50
HOST SYSTEM
51
CONTROL UNIT
70
VACUUM
CONTROL PANEL

DEGREE OF VACUUM
TIMING SIGNAL
T3
INTERLOCK SIGNAL

ACCELERATOR SYSTEM AND DISCHARGE DETECTOR

CROSS-REFERENCE TO RELATED APPLICATIONS

This application claims priority to Japanese Patent Application No. 2023-218202, filed on Dec. 25, 2023, which is incorporated by reference herein in its entirety.

BACKGROUND

Technical Field

Certain embodiments of the present invention relate to an accelerator system and a discharge detector.

Description of Related Art

An accelerator system of the related art is known as a technique in the field of the related art. The accelerator system accelerates particles by generating a high frequency electric field in a cavity inside an accelerator.

SUMMARY

According to an embodiment of the present invention, there is provided an accelerator system including an accelerator that accelerates particles, and a discharge detector that detects discharge inside the accelerator, in which the discharge detector blocks the discharge at a preliminary stage in which an influence of the discharge occurs inside the accelerator, based on detecting continuous discharge.

According to another embodiment of the present invention, there is provided a discharge detector that detects discharge inside an accelerator which accelerates particles, the discharge detector being configured to block the discharge at a preliminary stage in which an influence of the discharge occurs inside the accelerator, based on detecting continuous discharge.

DETAILED DESCRIPTION

Figure 1:
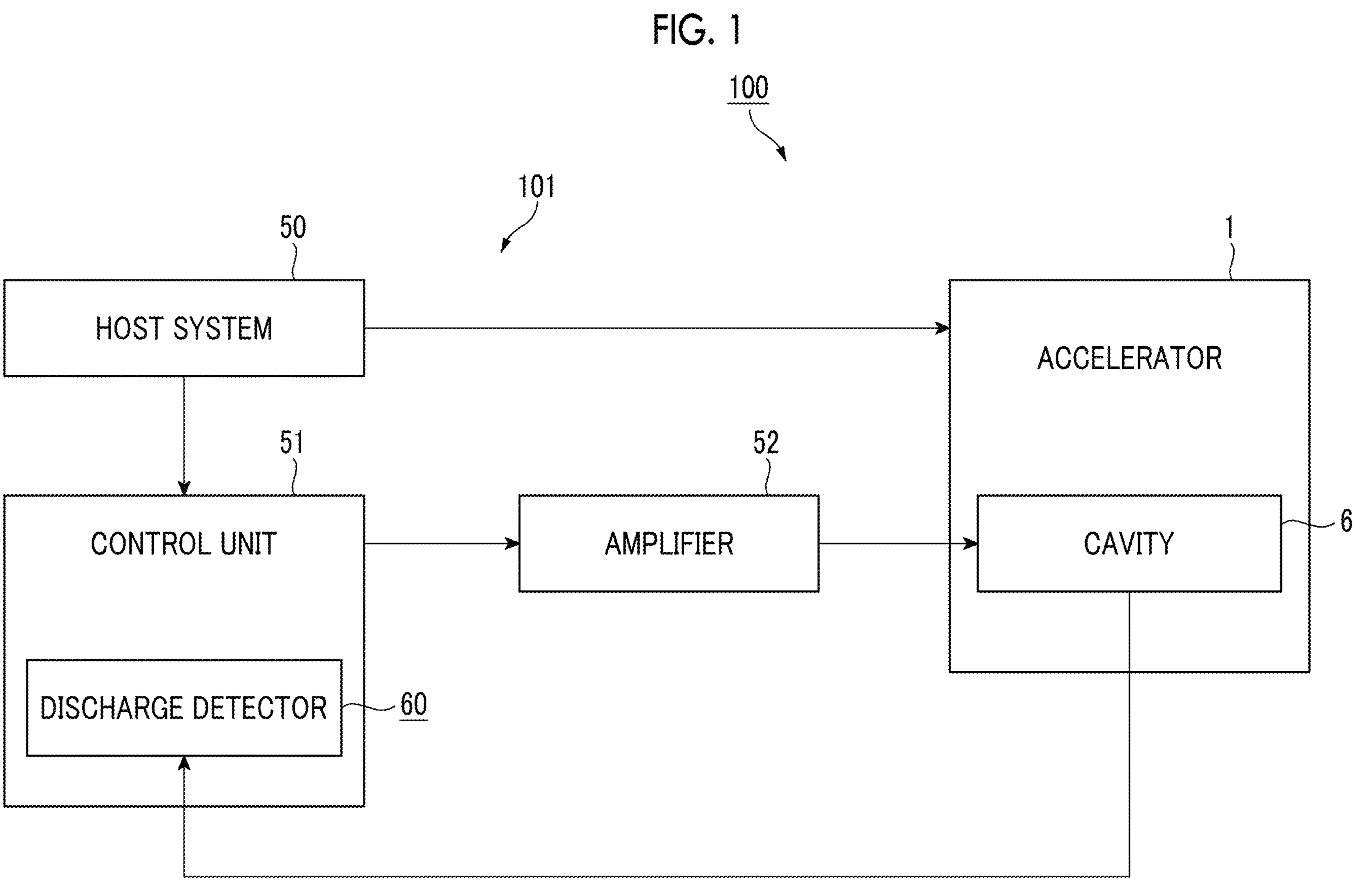
FIG. 1 is a block diagram showing an accelerator system according to an embodiment

Here, in the accelerator system as described above, there is a case where discharge occurs inside the accelerator (for example, in a cavity). In a case where in such discharge, continuous discharge occurs, an influence of the discharge, such as a discharge mark, a current path, or a scratch on an inner wall, occurs inside the accelerator. In a case where the influence of the discharge occurs in this manner, issues such as damage to the internal components of the accelerator and deterioration in performance occur. With respect to solve such issues, a method of confirming discharge by using an increase or decrease in the degree of vacuum inside the accelerator has been adopted in the related art. Since such a method performs detection, based on an indirect index caused by the occurrence of the continuous discharge, there is a large time lag from the occurrence of the continuous discharge to the detection. Therefore, there is an issue in that the influence occurring inside the accelerator due to the continuous discharge cannot be sufficiently suppressed.

It is desirable to provide an accelerator system and a discharge detector, in which it is possible to suppress an influence on the interior of an accelerator due to discharge. The accelerator system according to an embodiment of the present invention includes the discharge detector that detects discharge inside the accelerator. The discharge detector blocks the discharge at a preliminary stage in which an influence of the discharge occurs inside the accelerator, based on detecting the continuous discharge. Therefore, even in a case where the continuous discharge occurs inside the accelerator, the discharge can be blocked at an early stage, so that it is possible to suppress the occurrence of the influence of the discharge. From the above, the influence on the interior of the accelerator due to the discharge can be suppressed.

The discharge detector may block the discharge, based on an electric waveform of a cavity of the accelerator. The electric waveform of the cavity is different from the degree of vacuum or the like inside the accelerator, and the occurrence of discharge can be directly detected. Therefore, in a case where the continuous discharge occurs, the discharge detector can quickly detect the discharge.

The accelerator system may include a host system that controls the accelerator, and a control unit that controls voltage application to the cavity of the accelerator, in which the control unit may include a discharge detector. In this case, the discharge detector can detect the discharge by the control unit that controls the cavity without going through the host system. Therefore, the discharge detector can quickly detect the discharge.

The discharge detector may block the discharge in a case where the discharge detector detects that the number of times of discharge within a predetermined time in the cavity of the accelerator is equal to or more than a predetermined number of times. In this case, the discharge detector can detect continuous discharge of a type in which single discharge is repeatedly generated.

The discharge detector may block the discharge in a case where the discharge detector detects that the discharge in the cavity of the accelerator continues for a predetermined time or longer. In this case, the discharge detector can detect continuous discharge of a type in which discharge continues.

The discharge detector may block the discharge when the electric waveform of the cavity of the accelerator is shorted for a predetermined time. In this case, the discharge detector can detect continuous discharge caused by the short.

According to the discharge detector, it is possible to obtain the same operation and effects as those of the accelerator system described above.

Hereinafter, an embodiment of the present invention will be described with reference to the drawings. In the description of the drawings, identical or equivalent elements are denoted by the same reference numerals, and overlapping description will be omitted. In addition, a positional relationship such as up, down, left, and right is based on a positional relationship in the drawing.

FIG. 1 is a block diagram showing an accelerator system 100 according to the present embodiment. As shown in FIG. 1, the accelerator system 100 includes an accelerator 1 and a control system 101. The accelerator 1 is a device that accelerates particles to generate a beam. The control system 101 controls the accelerator 1.

Figure 2:
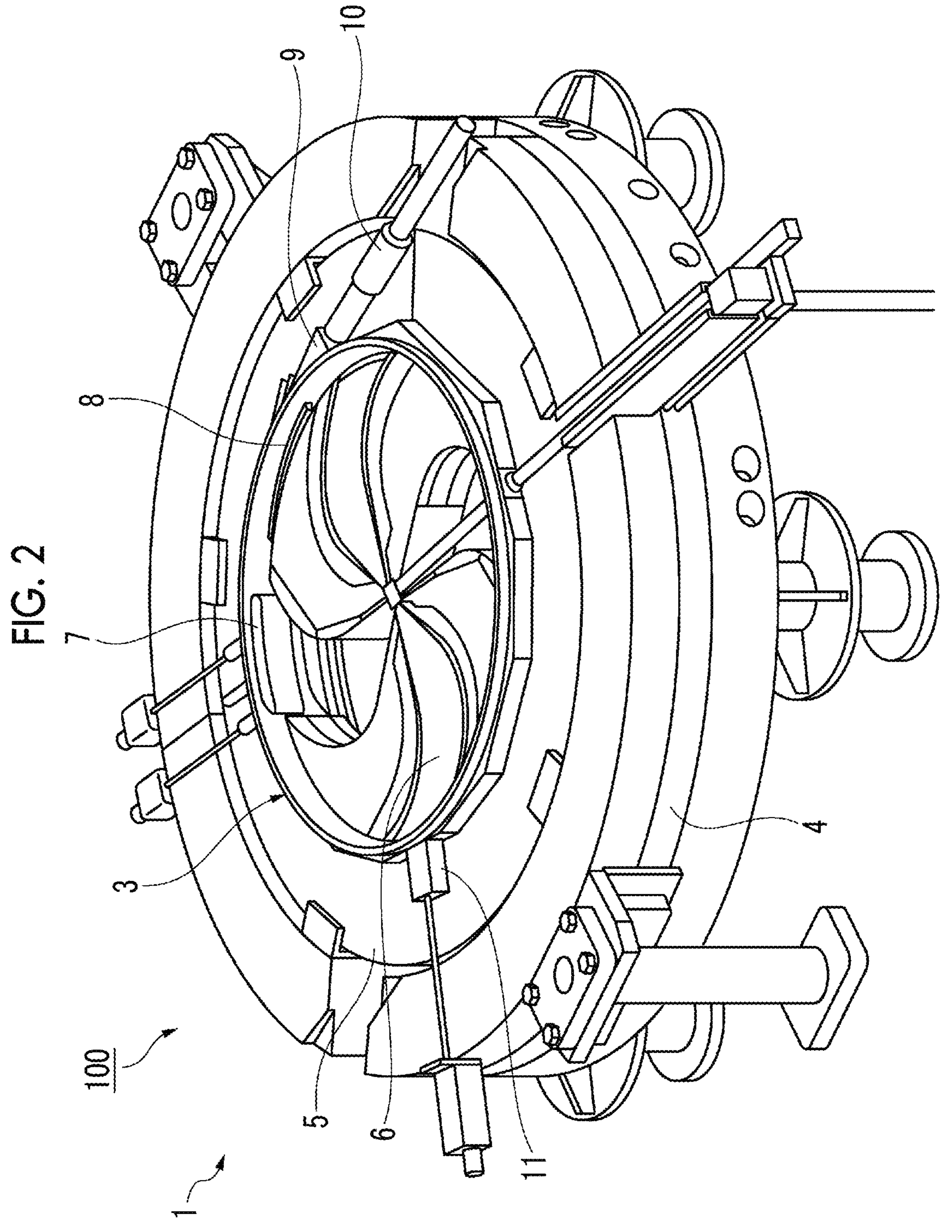
FIG. 2 is a perspective view showing an accelerator.

The accelerator 1 will be described with reference to FIG. 2. FIG. 2 is a perspective view showing the interior of the accelerator 1. In FIG. 2, a state where an upper portion of the accelerator 1 is removed and built-in components are visible is shown. In the present embodiment, a cyclotron is exemplified as the accelerator 1.

The accelerator 1 is for generating a proton beam, accelerates cations (particles) of hydrogen supplied from an ion source (not shown) in the interior of a vacuum chamber 3 to generate a proton beam, and causes the proton beam to outgo. The vacuum chamber 3 is formed of, for example, stainless steel or the like. In addition, a vacuum pump (not shown) is connected to the vacuum chamber 3. The vacuum chamber 3 forms a vacuum environment in which ions are accelerated.

The accelerator 1 includes a yoke 4 disposed to face upward and downward, and an excitation coil 5 that forms a magnetic field in the vacuum chamber 3. In addition, the accelerator 1 includes a cavity 6 that generates a high frequency electric field in order to impart energy to the proton beam, and an RF tuner 11 that adjusts a resonance frequency of the cavity 6.

A magnetic field is formed in the vacuum chamber 3 by the yoke 4 and the excitation coil 5, and a high frequency electric field is formed in the cavity 6. In this way, the proton beam performs an orbiting motion along a spiral trajectory, and an advancing speed of the proton beam increases as a radius of an orbiting trajectory increases. In FIG. 2, the yoke 4 on a lower side is shown, and the yoke 4 on an upper side is omitted.

In addition, the accelerator 1 includes a deflector 7 that is installed on an inner surface side of a side wall of the vacuum chamber 3 to extract the accelerated proton beam, a gradient corrector 8 for correcting a magnetic field gradient, a collimator 9 for causing the proton beam to outgo in a predetermined direction (horizontal direction), and a permanent quadrupole magnet (quadrupole) 10 for adjusting a focus of the outgoing proton beam. The proton beam accelerated in the vacuum chamber 3 is extracted by the deflector 7, the magnetic field gradient is corrected by the gradient corrector 8, and the outgoing direction is adjusted by the collimator 9. The focus of the outgoing proton beam is adjusted by the permanent quadrupole magnet 10.

Figure 3:
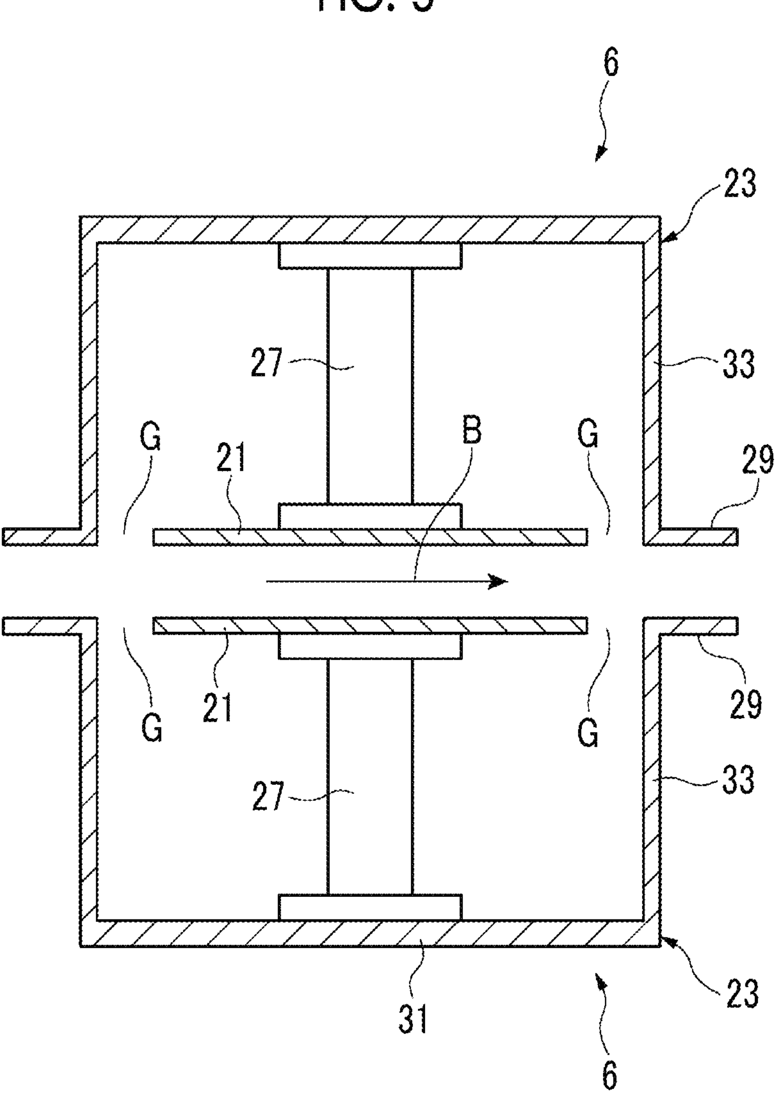
FIG. 3 is a schematic diagram showing a cavity

FIG. 3 is a schematic sectional view of the cavity 6. In the accelerator 1, a pair of cavities 6 are provided above and below the passage of a proton beam B. As shown in FIG. 3, the pair of cavities 6 have substantially vertically symmetrical and identical or equivalent structures. Therefore, in the following, in order to omit overlapping description, only the structure of the cavity 6 located below will be described.

The cavity 6 includes a dee electrode 21, an earth plate 23, and a stem 27. The earth plate 23 is spaced apart from the dee electrode 21, has a bottomed cup shape that accommodates the dee electrode 21 therein, and is fitted into a recessed portion of the yoke 4. The earth plate 23 is made of, for example, oxygen-free copper. The stem 27 extends upward from a bottom surface of the earth plate 23, and the dee electrode 21 is fixed to an upper end of the stem 27.

An upper end edge portion of the earth plate 23 configures a counter dee 29. In addition, a gap is provided between the upper end edge portion of the earth plate 23 and the dee electrode 21, and this gap configures an acceleration gap G between the dee electrode 21 and the counter dee 29. A high frequency electric field corresponding to a rotation phase of the proton beam B is generated between the dee electrode 21 and the counter dee 29, so that the proton beam B is accelerated every time the proton beam B passes through the acceleration gap G.

Returning to FIG. 1, the control system 101 includes a host system 50, a control unit 51, and an amplifier 52. The host system 50 is a system that controls the accelerator 1. The host system 50 controls the operation of the entire accelerator 1. The control unit 51 controls the voltage application to the cavity 6 of the accelerator 1. The control unit 51 receives a control signal from the host system 50, and controls the cavity 6, based on the control signal. The amplifier 52 is a device that amplifies an input signal to the cavity 6 from the control unit 51.

The control unit 51 includes a discharge detector 60. The discharge detector 60 detects discharge inside the accelerator 1. The discharge detector 60 is a device that blocks the discharge in a preliminary stage in which the influence of the discharge occurs inside the accelerator 1, based on detecting continuous discharge. Here, the cavity 6 has an electrode to which a high electric field is applied, so that a discharge phenomenon occurs. Single discharge and continuous discharge are included in the discharge phenomenon. The single discharge is a discharge phenomenon in which discharge is completed in a short time with one-shot. The continuous discharge is a discharge phenomenon in which discharge is continuously performed. The continuous discharge includes discharge of a type in which single discharge is repeated a plurality of times during a short period (indicated by "TP1" in FIG. 4) and discharge of a type in which discharge is continued for a predetermined time (indicated by "TP2" in FIG. 4).

Figure 8A:
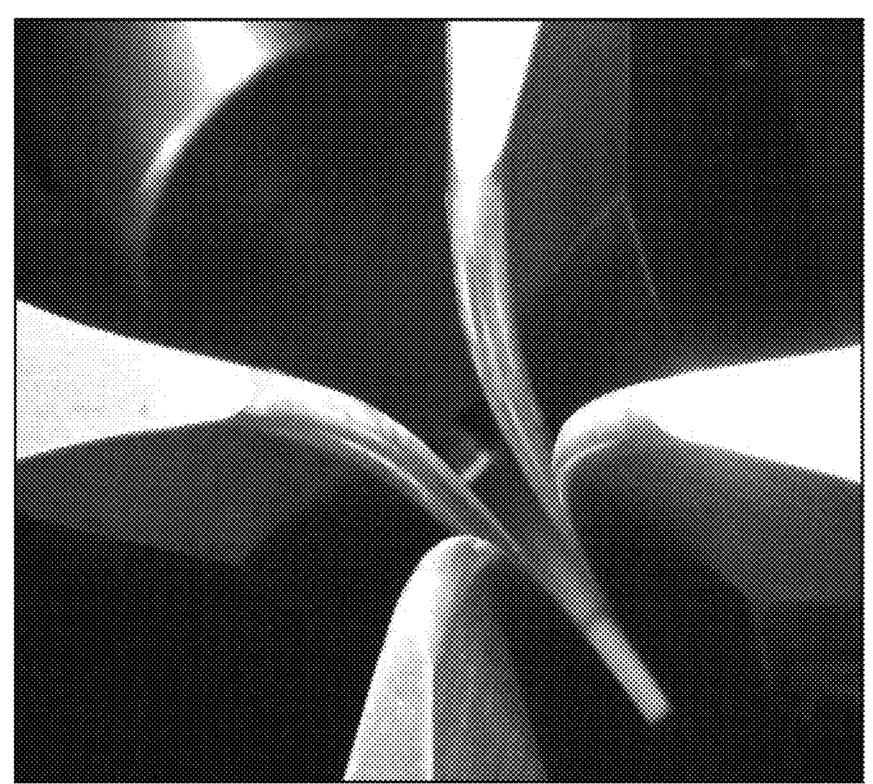
FIGS. 8A and 8B are photographs showing an example of an influence on the interior of the accelerator due to continuous discharge.
Figure 8B:
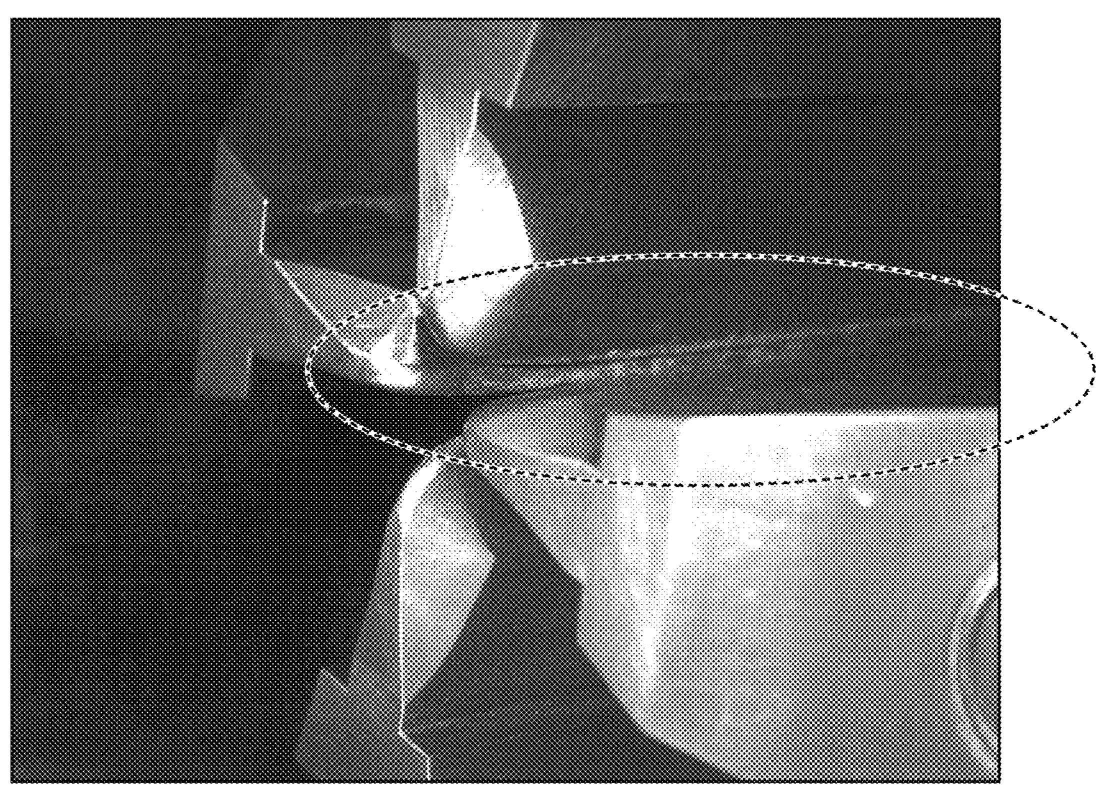

The continuous discharge generates an influence (influence due to discharge) such as a discharge mark or a current path in the interior of the cavity 6 or a scratch on the inner wall, and includes a possibility of causing damage to the cavity and deterioration in performance. For that reason, the discharge detector 60 performs an interlock when the continuous discharge occurs, and protects the cavity 6 by blocking the discharge at a preliminary stage in which the influence of the discharge occurs inside the accelerator 1. FIG. 8A is a photograph showing the state of the interior of the cavity 6 before the continuous discharge occurs and the influence of the discharge appears. FIG. 8B is a photograph showing the state of the interior of the cavity 6 after the influence of the discharge has occurred without performing the protection by the discharge detector 60 of the present embodiment in a case where the continuous discharge has occurred. As shown at "A" in FIG. 8B, it is shown that a discharge mark is formed as the influence of the continuous discharge. The discharge detector 60 blocks the discharge in a preliminary stage in which such a discharge mark is generated.

Figure 4:
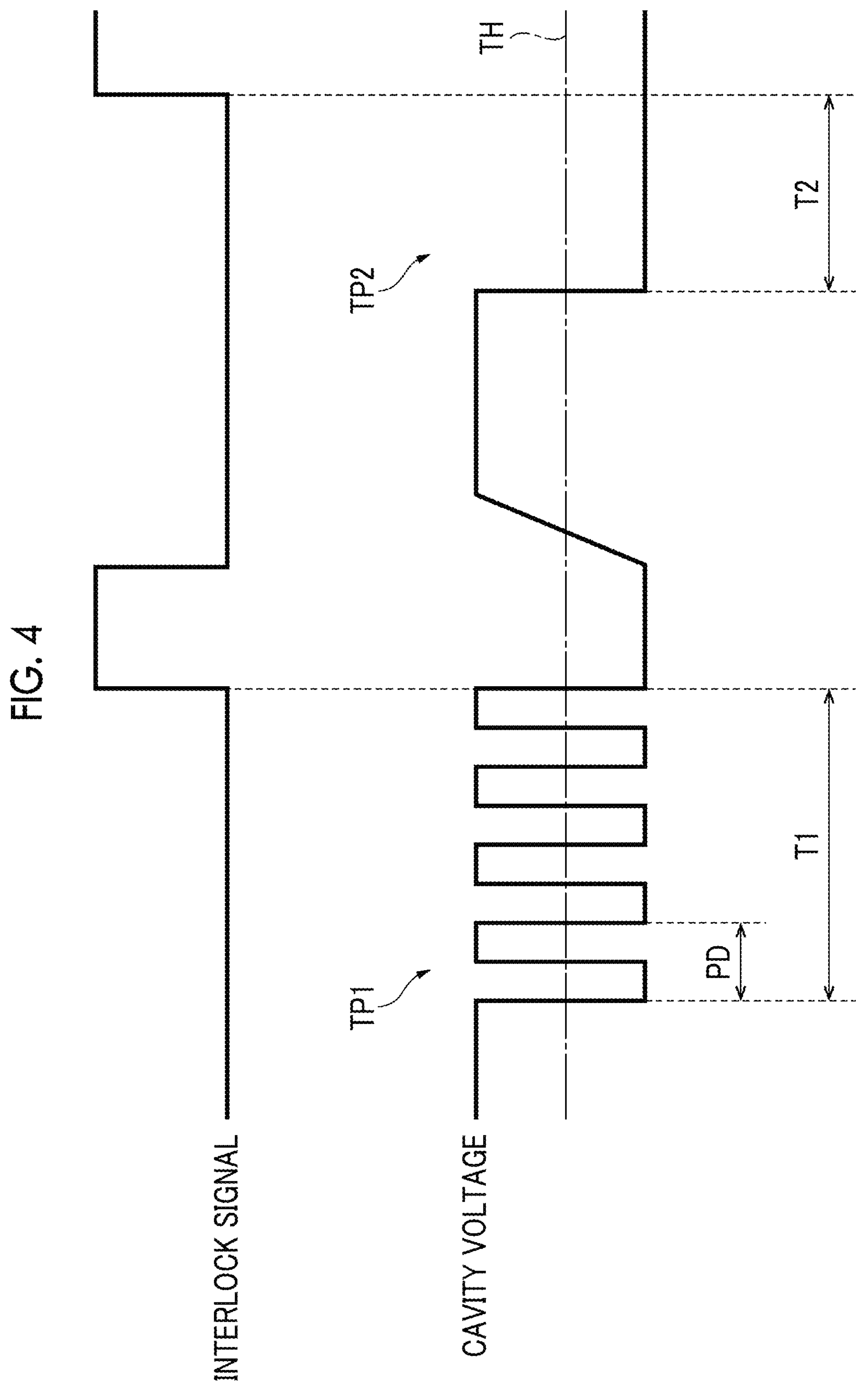
FIG. 4 is a graph showing a waveform for detection of a discharge detector.

Here, when the discharge detector 60 responds to the single discharge to block the discharge, the interlock is performed at a high frequency even though the discharge does not cause the influence of discharge. Therefore, the discharge detector 60 does not respond to the single discharge, and performs the interlock only when the continuous discharge occurs. The discharge detector 60 blocks the discharge, based on an electric waveform of the cavity 6 of the accelerator 1. For example, as shown in FIG. 4, the discharge detector 60 detects that the continuous discharge has occurred, based on a waveform of a cavity voltage obtained by detecting the cavity voltage of the cavity 6. Then, when the discharge detector 60 detects the occurrence of the continuous discharge, based on the waveform, the discharge detector 60 performs the interlock to interrupt the voltage application to the cavity 6 to block the discharge.

Specifically, the discharge detector 60 blocks the discharge in a case where the discharge detector 60 detects that the number of times of discharge within a predetermined time in the cavity 6 of the accelerator 1 is equal to or more than a predetermined number of times. As shown in FIG. 4, in a case where discharge does not occur, the cavity voltage becomes a constant voltage. On the other hand, when discharge occurs, the cavity voltage falls below a discharge threshold TH. When the discharge detector 60 detects the discharge that falls below the discharge threshold TH, the discharge detector 60 starts time measurement. In the case of continuous discharge of a type in which the single discharge is repeated, the cavity voltage immediately returns. However, the next single discharge immediately occurs. The discharge detector 60 counts the number of times of discharge. The discharge detector 60 counts the number of times of discharge for a predetermined count time T1 set in advance. The discharge detector 60 detects that continuous discharge is generated, in a case where the number of times of discharge generated during the count time T1 is equal to or more than a predetermined number of counts set in advance. Alternatively, the discharge detector 60 may detect the continuous discharge at the point in time when the number of times of discharge reaches a predetermined number of counts at a preliminary stage in which the count time T1 elapses. When the discharge detector 60 detects the continuous discharge, the discharge detector 60 outputs an interlock signal to interrupt the voltage application to the cavity 6. In this way, the discharge in the cavity 6 is blocked. The length of the count time T1 is not particularly limited and can be optionally set, but may be set to be, for example, in a range of about 2 μs to 65000 μs. A discharge cycle PD during the continuous discharge is about 2 μs.

In addition, the discharge detector 60 blocks the discharge in a case where the discharge detector 60 detects that the discharge in the cavity 6 of the accelerator 1 continues for a predetermined time or longer. That is, the discharge detector 60 blocks the discharge when the electric waveform of the cavity 6 of the accelerator 1 is shorted for a predetermined time. As shown in FIG. 4, even though a predetermined voltage is applied to the cavity 6, there is a case where a state in which the cavity voltage falls below the discharge threshold TH is continued and the waveform is shorted (refer to "TP2" in FIG. 4). When the discharge detector 60 detects the discharge that falls below the discharge threshold TH, the discharge detector 60 starts time measurement. In the case of the continuous discharge of a type in which the discharge continues, the cavity voltage continues to be in a state of falling below the discharge threshold TH without returning. The discharge detector 60 determines whether or not the state continues for a predetermined duration T2 set in advance. When the discharge detector 60 detects that a state where the cavity voltage falls below the discharge threshold TH continues for the duration T2 or longer, the discharge detector 60 detects that continuous discharge is generated. When the discharge detector 60 detects the continuous discharge, the discharge detector 60 outputs an interlock signal to interrupt the voltage application to the cavity 6. In this way, the discharge in the cavity 6 is blocked. The length of the duration T2 is not particularly limited and can be optionally set, but may be set to be, for example, in a range of about 2 μs to 65000 μs.

Figure 5:
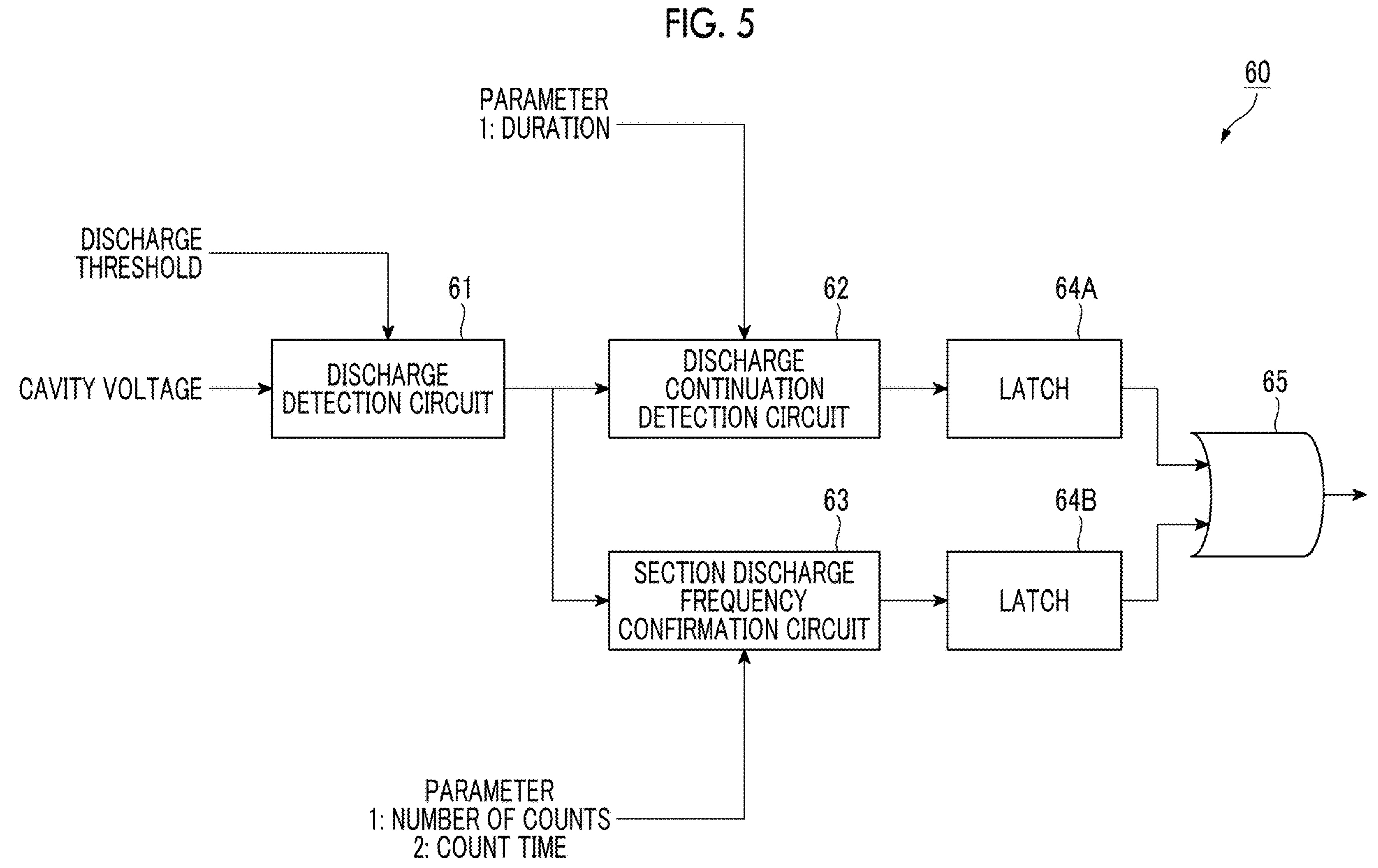
FIG. 5 is a circuit diagram showing a circuit configuration of the discharge detector.

Next, an example of a specific configuration of the discharge detector 60 will be described with reference to FIG. 5. FIG. 5 is a circuit diagram showing the circuit configuration of the discharge detector 60. As shown in FIG. 5, the discharge detector 60 includes a discharge detection circuit 61, a discharge continuation detection circuit 62, a section discharge frequency confirmation circuit 63, latches 64A and 64B, and an OR circuit 65.

The discharge detection circuit 61 is a circuit that monitors the cavity power and detects the occurrence of the discharge. The value of the discharge threshold TH is input to the discharge detection circuit 61 before the operation of the accelerator 1. In this way, the discharge detection circuit 61 sets the input value as the discharge threshold TH. During the operation of the accelerator 1, the cavity voltage is input to the discharge detection circuit 61. In this way, the discharge detection circuit 61 detects the discharge by comparing the input cavity voltage with the discharge threshold TH. The discharge detection circuit 61 outputs a detection result of the discharge to the discharge continuation detection circuit 62 and the section discharge frequency confirmation circuit 63.

The discharge continuation detection circuit 62 is a circuit that detects the continuous discharge of a type (TP2) that continues. The value of the duration T2 is input to the discharge continuation detection circuit 62 as a parameter before the operation of the accelerator 1. The discharge continuation detection circuit 62 sets the input value as the duration T2. When the discharge continuation detection circuit 62 detects that the discharge continues for the duration T2 or longer, the discharge continuation detection circuit 62 outputs an interlock command signal to the OR circuit 65 via the latch 64A.

The section discharge frequency confirmation circuit 63 is a circuit that detects the continuous discharge of a type (TP1) in which the single discharge is repeated. The values of the number of counts and the count time T1 are input to the section discharge frequency confirmation circuit 63 as parameters before the operation of the accelerator 1. The section discharge frequency confirmation circuit 63 sets the input values as the number of counts and the count time T1. When the section discharge frequency confirmation circuit 63 detects that the discharge equal to or more than the number of counts continues for the duration T2 or longer during the count time T1, the section discharge frequency confirmation circuit 63 outputs an interlock command signal to the OR circuit 65 via the latch 64B.

The latches 64A and 64B are devices that a function to maintain the states of the circuits 62 and 63. The latches 63A and 64 output the interlock command signal to the OR circuit 65 when the interlock command signal is received from the circuits 62 and 63. When the interlock command signal is received from at least one of the discharge continuation detection circuit 62 and the section discharge frequency confirmation circuit 63, the OR circuit 65 outputs the command signal to an interlock unit (not shown) of the control unit 51.

Next, the operation and effects of the accelerator system 100 and the discharge detector 60 according to the embodiment of the present invention will be described.

Figure 6:
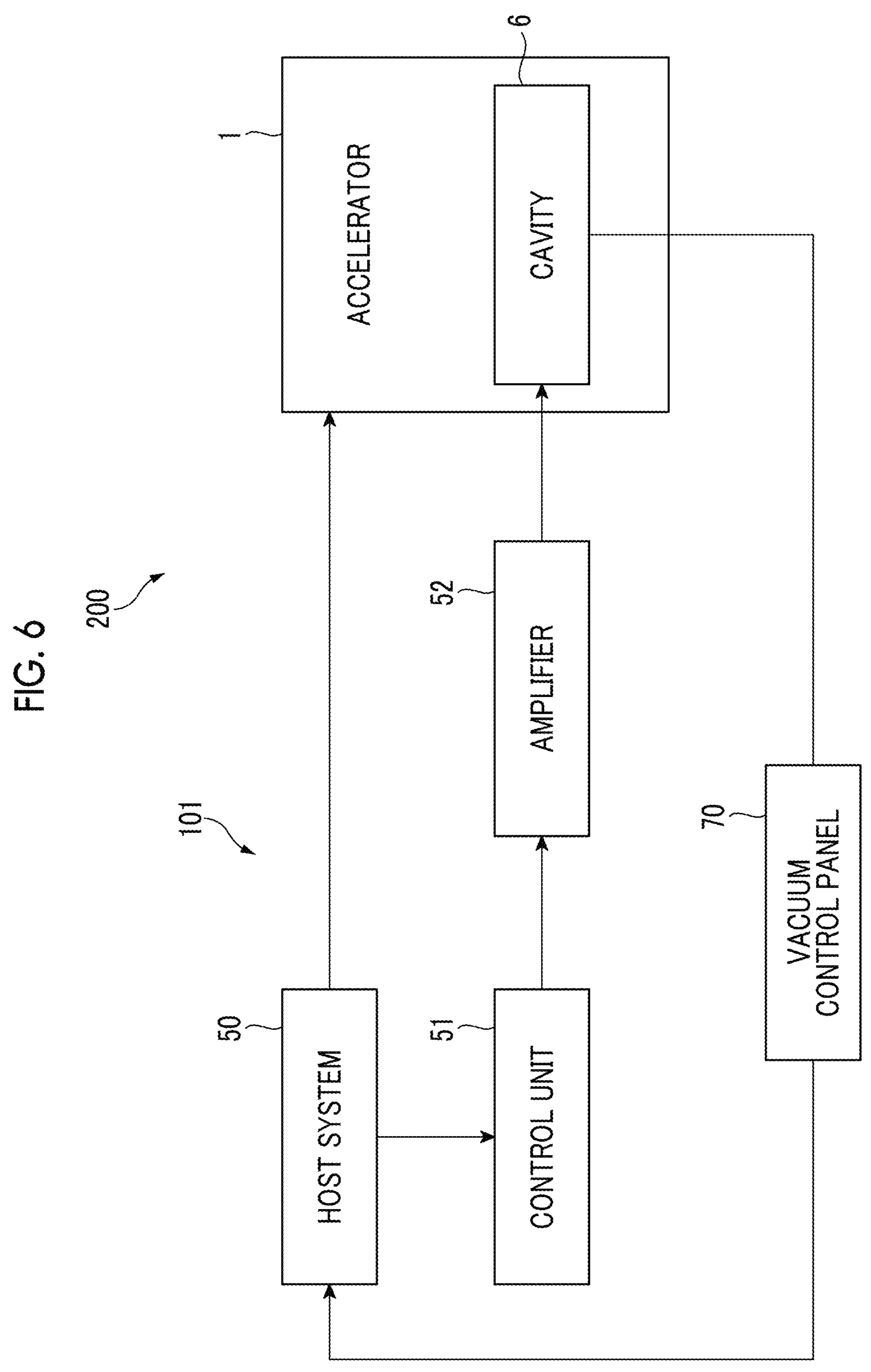
FIG. 6 is a block diagram showing an accelerator system according to a comparative example.

First, an accelerator system 200 according to a comparative example will be described with reference to FIGS. 6 and 7. In the accelerator system 200 according to the comparative example, the continuous discharge is detected by using a vacuum control panel 70 instead of the discharge detector 60 described above. The vacuum control panel 70 is a device that detects the degree of vacuum in the interior of the cavity 6. The vacuum control panel 70 receives the degree of vacuum in the interior of the cavity 6 and outputs the degree of vacuum to the host system 50. The host system 50 detects the generation of the continuous discharge, based on the received degree of vacuum, and when the continuous discharge is detected, the host system 50 performs the interlock. The host system 50 outputs a command signal for stopping the voltage application to the cavity 6 to the control unit 51. The control unit 51 interrupts the voltage application to the cavity 6 to block the discharge, based on the command signal.

Figure 7:
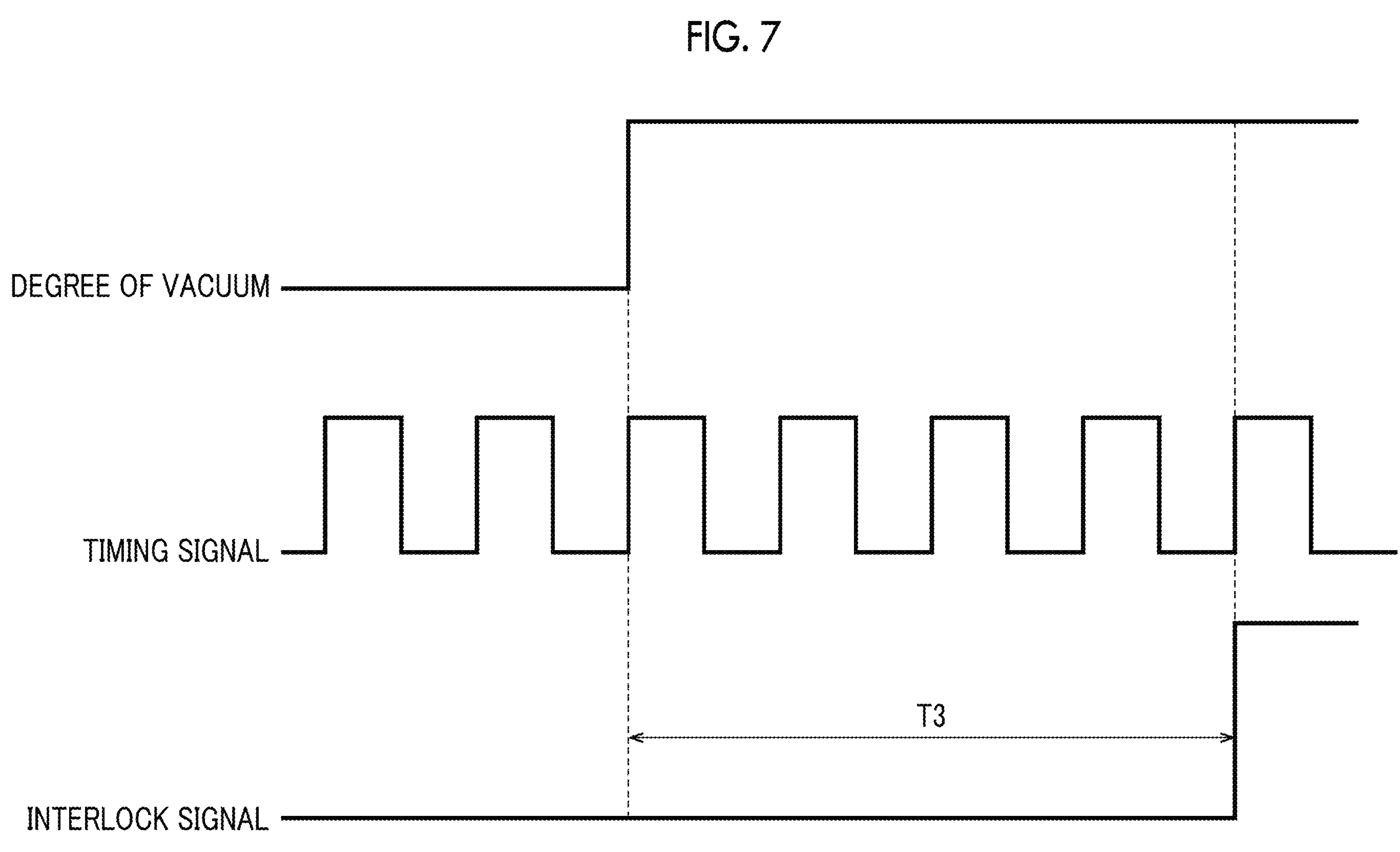
FIG. 7 is a graph showing a waveform for discharge detection in the accelerator system according to the comparative example.

For example, in the accelerator system 200 according to the comparative example, the host system 50 performs detection based on a timing signal, as shown in FIG. 7. When the host system 50 detects deterioration in the degree of vacuum, the host system 50 performs monitoring for a predetermined time T3. The host system 50 detects the continuous discharge when detecting that a state in which the degree of vacuum is deteriorated continues for the predetermined time T3. The timing signal of the host system 50 has a cycle in a range of 1 Hz to 10 Hz, and a time in a range of about 0.1 s to 1 s is required for one cycle. Therefore, the time T3 is set to a time of several seconds. In addition, in FIG. 7, for convenience, a state where the degree of vacuum quickly changes is shown. However, even when the continuous discharge occurs, the degree of vacuum gradually changes. Therefore, it takes a certain amount of time until the deterioration in the degree of vacuum can be detected. From the above, in the accelerator system 200 according to the comparative example, it takes about several seconds from the generation of the continuous discharge to the implementation of the interlock. Therefore, there is a case where the discharge may affect the cavity in a time until the interlock is performed.

In contrast, the accelerator system 100 according to the present embodiment includes the discharge detector 60 that detects the discharge inside the accelerator 1. The discharge detector 60 blocks the discharge in a preliminary stage in which the influence of the discharge occurs inside the accelerator 1, based on detecting the continuous discharge. Therefore, even in a case where continuous discharge occurs inside the accelerator 1, the discharge can be blocked at an early stage, so that it is possible to suppress the occurrence of an influence due to the discharge. From the above, the influence on the interior of the accelerator 1 due to the discharge can be suppressed.

The discharge detector 60 may block the discharge, based on the electric waveform of the cavity 6 of the accelerator 1. The electric waveform of the cavity 6 is different from the degree of vacuum or the like inside the accelerator 1, and it is possible to directly detect the occurrence of the discharge. Therefore, in a case where the continuous discharge occurs, the discharge detector 60 can quickly detect the discharge.

The accelerator system 100 may include the host system 50 that controls the accelerator 1, and the control unit 51 that controls the voltage application to the cavity 6 of the accelerator 1, in which the control unit 51 may include the discharge detector 60. In this case, the discharge detector 60 can detect the discharge by the control unit 51 that controls the cavity 6, without going through the host system 50. Therefore, the discharge detector 60 can quickly detect the discharge.

The discharge detector 60 may block the discharge in a case where the discharge detector 60 detects that the number of times of discharge within a predetermined time in the cavity 6 of the accelerator 1 is equal to or more than a predetermined number of times. In this case, the discharge detector 60 can detect the continuous discharge of a type in which the single discharge is repeatedly generated.

The discharge detector 60 may block the discharge in a case where the discharge detector 60 detects that the discharge in the cavity 6 of the accelerator 1 continues for a predetermined time or longer. In this case, the discharge detector 60 can detect the continuous discharge of a type in which the discharge continues.

The discharge detector 60 may block the discharge when the electric waveform of the cavity 6 of the accelerator 1 is shorted for a predetermined time. In this case, the discharge detector 60 can detect the continuous discharge caused by the short.

The discharge detector 60 according to the present embodiment is the discharge detector 60 that detects discharge inside the accelerator 1 that accelerates particles, and may block the discharge at a preliminary stage in which an influence of the discharge occurs inside the accelerator 1, based on detecting the continuous discharge.

According to the discharge detector 60, it is possible to obtain the same operation and effects as those of the accelerator system 100 described above.

The present invention is not limited to the embodiment described above.

The type of the accelerator is not limited to the cyclotron. For example, as the accelerator, various accelerators such as a linear accelerator and a synchrotron may be adopted. In addition, a target to be detected for the discharge is not limited to the cavity, and the present invention is appropriately applicable to a device using a high frequency, such as a deflector or an ion source. The present invention is also applicable to the DC power source in the accelerator 1 in general.

It should be understood that the invention is not limited to the above-described embodiment, but may be modified into various forms on the basis of the spirit of the invention. Additionally, the modifications are included in the scope of the invention.

What is claimed is:

1. An accelerator system comprising:

an accelerator that accelerates particles; and a discharge detector that detects discharge inside the accelerator, wherein the discharge detector blocks the discharge at a preliminary stage in which an influence of the discharge occurs inside the accelerator, based on detecting continuous discharge.

2. The accelerator system according to claim 1, wherein the discharge detector blocks the discharge, based on an electric waveform of a cavity of the accelerator.

3. The accelerator system according to claim 2, wherein the accelerator includes a yoke, an excitation coil, and an RF tuner that adjusts a resonance frequency of the cavity, and a magnetic field is formed in a vacuum chamber by the yoke and the excitation coil, and a high frequency electric field is formed by the cavity.

4. The accelerator system according to claim 3, wherein the cavity includes a dee electrode, an earth plate, and a stem, the earth plate is spaced apart from the dee electrode, has a bottomed cup shape that accommodates the dee electrode therein, and is fitted into a recessed portion of the yoke, and the stem extending upward from a bottom surface of the earth plate, and the dee electrode is fixed to an upper end of the stem.

5. The accelerator system according to claim 4, wherein the earth plate configures a counter dee at an upper end edge portion thereof, and a gap is provided between the upper end edge portion of the earth plate and the dee electrode to configure an acceleration gap between the dee electrode and the counter dee.

6. The accelerator system according to claim 1, further comprising:

a host system that controls the accelerator; and a control unit that controls voltage application to a cavity of the accelerator, wherein the control unit includes the discharge detector.

7. The accelerator system according to claim 1, wherein the discharge detector blocks the discharge in a case where the discharge detector detects that the number of times of discharge within a predetermined time in a cavity of the accelerator is equal to or more than a predetermined number of times.

8. The accelerator system according to claim 1, wherein the discharge detector blocks the discharge in a case where the discharge detector detects that the discharge in a cavity of the accelerator continues for a predetermined time or longer.

9. The accelerator system according to claim 1, wherein the discharge detector blocks the discharge when an electric waveform of a cavity of the accelerator is shorted for a predetermined time.

10. The accelerator system according to claim 1, wherein a control system includes an amplifier, and amplifies an input signal from a control unit to a cavity.

11. A discharge detector that detects discharge inside an accelerator that accelerates particles, the discharge detector being configured to block the discharge at a preliminary stage in which an influence of the discharge occurs inside the accelerator, based on detecting continuous discharge.

* * * * *